(12) United States Patent
Jang et al.

(10) Patent No.: US 8,389,398 B2
(45) Date of Patent: *Mar. 5, 2013

(54) METHOD OF FORMING VERTICALLY OFFSET BOND ON TRACE INTERCONNECTS ON RECESSED AND RAISED BOND FINGERS

(75) Inventors: KiYoun Jang, Kyoungki-do (KR); SungSoo Kim, Seoul (KR); YongHee Kang, Kyoung-gi-Do (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/431,816

(22) Filed: Mar. 27, 2012

(65) Prior Publication Data

US 2012/0181690 A1 Jul. 19, 2012

Related U.S. Application Data

(60) Continuation of application No. 13/019,562, filed on Feb. 2, 2011, now Pat. No. 8,169,071, which is a division of application No. 12/207,986, filed on Sep. 10, 2008, now Pat. No. 7,897,502.

(51) Int. Cl.
*H01L 21/44* (2006.01)
(52) U.S. Cl. ........ 438/614; 438/612; 438/613; 438/617; 438/E21.502
(58) Field of Classification Search .......... 438/106–131, 438/612–617, 618–624; 257/690, 21.502, 257/E23.01 E
See application file for complete search history.

(56) References Cited

U.S. PATENT DOCUMENTS 5,378,859 A  1/1995 Shirasaki et al.
(Continued)

FOREIGN PATENT DOCUMENTS

JP  04-355933  9/1992
JP  10-256307  9/1998
(Continued)

OTHER PUBLICATIONS

Yamada, Hiroshi et al., "Advanced copper column based solder bump for flip-chip interconnection", International Symposium on Microelectronics, 1997, pp. 417-422, The British Library—"The world's knowledge".

(Continued)

*Primary Examiner* — Dung A. Le
(74) *Attorney, Agent, or Firm* — Robert D. Atkins; Patent Law Group: Atkins & Associates, P.C.

(57) ABSTRACT

A method of making a semiconductor device comprises providing a carrier, forming a first conductive layer extending above a surface of the carrier, providing a substrate, disposing the first conductive layer into a first surface of the substrate, removing the carrier, forming a second conductive layer extending above the first surface of the substrate to create a vertical offset between the first conductive layer and second conductive layer, and forming a plurality of first bumps over the first conductive layer and second conductive layer. The method further includes the steps of disposing a third conductive layer into a second surface of the substrate opposite the first surface of the substrate, forming a fourth conductive layer extending above the second surface of the substrate to create a vertical offset between the third conductive layer and fourth conductive layer, and forming a plurality of second bumps.

19 Claims, 7 Drawing Sheets

U.S. PATENT DOCUMENTS

| | | |
|---|---|---|
| 5,386,624 A | 2/1995 | George et al. |
| 5,434,410 A | 7/1995 | Kulwicki |
| 5,508,561 A | 4/1996 | Tago et al. |
| 5,519,580 A | 5/1996 | Natarajan et al. |
| 5,650,595 A | 7/1997 | Bentlage et al. |
| 5,710,071 A | 1/1998 | Beddingfield et al. |
| 5,844,782 A | 12/1998 | Fukasawa |
| 5,869,886 A | 2/1999 | Tokuno |
| 5,872,399 A | 2/1999 | Lee |
| 5,889,326 A | 3/1999 | Tanaka |
| 5,915,169 A | 6/1999 | Heo |
| 5,985,456 A | 11/1999 | Zhou et al. |
| 6,201,305 B1 | 3/2001 | Darveaux et al. |
| 6,218,630 B1 | 4/2001 | Takigami |
| 6,228,466 B1 | 5/2001 | Tsukada et al. |
| 6,259,163 B1 | 7/2001 | Ohuchi et al. |
| 6,281,450 B1 | 8/2001 | Urasaki et al. |
| 6,297,560 B1 | 10/2001 | Capote et al. |
| 6,324,754 B1 | 12/2001 | DiStefano et al. |
| 6,329,605 B1 | 12/2001 | Beroz et al. |
| 6,335,568 B1 | 1/2002 | Yuzawa et al. |
| 6,335,571 B1 | 1/2002 | Capote et al. |
| 6,396,707 B1 | 5/2002 | Huang et al. |
| 6,441,316 B1 | 8/2002 | Kusui |
| 6,448,665 B1 | 9/2002 | Nakazawa et al. |
| 6,573,610 B1 | 6/2003 | Tsai |
| 6,600,234 B2 | 7/2003 | Kuwabara et al. |
| 6,608,388 B2 | 8/2003 | Lin et al. |
| 6,710,458 B2 | 3/2004 | Seko |
| 6,734,557 B2 | 5/2004 | Taniguchi et al. |
| 6,774,497 B1 | 8/2004 | Qi et al. |
| 6,780,673 B2 | 8/2004 | Venkateswaran |
| 6,787,918 B1 | 9/2004 | Tsai et al. |
| 6,809,262 B1 | 10/2004 | Hsu |
| 6,818,545 B2 | 11/2004 | Lee et al. |
| 6,849,944 B2 | 2/2005 | Murtuza et al. |
| 6,870,276 B1 | 3/2005 | Moxham et al. |
| 6,888,255 B2 | 5/2005 | Murtuza et al. |
| 6,913,948 B2 | 7/2005 | Caletka et al. |
| 6,930,257 B1 | 8/2005 | Hiner et al. |
| 7,005,585 B2 | 2/2006 | Ishizaki |
| 7,005,750 B2 | 2/2006 | Liu |
| 7,025,607 B1 | 4/2006 | Das et al. |
| 7,049,705 B2 | 5/2006 | Huang |
| 7,057,284 B2 | 6/2006 | Chauhan et al. |
| 7,064,435 B2 | 6/2006 | Chung et al. |
| 7,098,407 B2 | 8/2006 | Kim et al. |
| 7,102,239 B2 | 9/2006 | Pu et al. |
| 7,173,828 B2 | 2/2007 | Lin et al. |
| 7,224,073 B2 | 5/2007 | Kim |
| 7,242,099 B2 | 7/2007 | Lin et al. |
| 7,271,484 B2 | 9/2007 | Reiss et al. |
| 7,294,929 B2 | 11/2007 | Miyazaki |
| 7,317,245 B1 | 1/2008 | Lee et al. |
| 7,405,484 B2 | 7/2008 | Usui et al. |
| 7,436,063 B2 | 10/2008 | Miyata et al. |
| 7,521,284 B2 | 4/2009 | Miranda et al. |
| 7,612,295 B2 | 11/2009 | Takada et al. |
| 7,642,660 B2 | 1/2010 | Tay et al. |
| 7,670,939 B2 | 3/2010 | Topacio et al. |
| 7,671,454 B2 | 3/2010 | Seko |
| 7,732,913 B2 | 6/2010 | Hsieh et al. |
| 7,750,457 B2 | 7/2010 | Seko |
| 7,790,509 B2 | 9/2010 | Gerber et al. |
| 7,791,211 B2 | 9/2010 | Chen et al. |
| 7,847,399 B2 | 12/2010 | Masumoto |
| 7,847,417 B2 | 12/2010 | Araki et al. |
| 7,851,928 B2 | 12/2010 | Gallegos et al. |
| 7,898,083 B2 | 3/2011 | Castro |
| 7,902,660 B1 | 3/2011 | Lee et al. |
| 7,902,678 B2 | 3/2011 | Ohuchi et al. |
| 7,902,679 B2 | 3/2011 | Lin et al. |
| 7,932,170 B1 | 4/2011 | Huemoeller et al. |
| 7,947,602 B2 | 5/2011 | Ito et al. |
| 2004/0056341 A1 | 3/2004 | Endo et al. |
| 2004/0232562 A1 | 11/2004 | Hortaleza et al. |
| 2005/0048695 A1 | 3/2005 | Chia et al. |
| 2005/0103516 A1 | 5/2005 | Kaneyuki |
| 2005/0248037 A1 | 11/2005 | Hung et al. |
| 2006/0102694 A1 | 5/2006 | Lee et al. |
| 2006/0113665 A1 | 6/2006 | Lee et al. |
| 2006/0131758 A1 | 6/2006 | Dao |
| 2006/0194373 A1 | 8/2006 | Fee et al. |
| 2007/0151756 A1 | 7/2007 | Yamashita et al. |
| 2007/0200234 A1 | 8/2007 | Gerber et al. |
| 2007/0235869 A1 | 10/2007 | Jang et al. |
| 2008/0093749 A1 | 4/2008 | Gerber et al. |
| 2008/0157358 A1 | 7/2008 | Yang |
| 2008/0179740 A1 | 7/2008 | Liao et al. |
| 2008/0277802 A1 | 11/2008 | Tsai et al. |
| 2009/0108445 A1 | 4/2009 | Liang |
| 2009/0114436 A1 | 5/2009 | Chen et al. |
| 2009/0152716 A1 | 6/2009 | Sohara |
| 2009/0191329 A1 | 7/2009 | Wang |
| 2009/0288866 A1 | 11/2009 | Tsai et al. |
| 2009/0308647 A1 | 12/2009 | Liao et al. |
| 2010/0139965 A1 | 6/2010 | Wang et al. |
| 2011/0049703 A1 | 3/2011 | Hsu et al. |

FOREIGN PATENT DOCUMENTS

| | | |
|---|---|---|
| JP | 2000-031204 | 1/2000 |
| JP | 2004-221205 | 5/2004 |

OTHER PUBLICATIONS

Yamada, Hiroshi et al., "A fine pitch and high aspect ratio bump array for flip-chip interconnection", Int'l Electronics Manufacturing Technology Symposium, 1992, pp. 288-292, IEEE/CHMT.

Son, Ho Young et al., "Studies on the Thermal Cycling Reliability of Fine Pitch Cu/SnAg Double-Bump Flip Chip Assemblies on Organic Substrates: Experimental Results and Numerical Analysis", Electronic Components and Technology Conference, 2008, pp. 2035-2043.

Lu, H. et al., "Predicting Optimal Process Conditions for Flip-Chip Assembly Using Copper Column Bumped Dies", Electronics Packaging Technology Conference, 2002, pp. 338-343.

Kawahara, Toshimi, "SuperCSP", IEEE Transactions on Advanced Packaging, May 2000, pp. 215-219, vol. 23, No. 2.

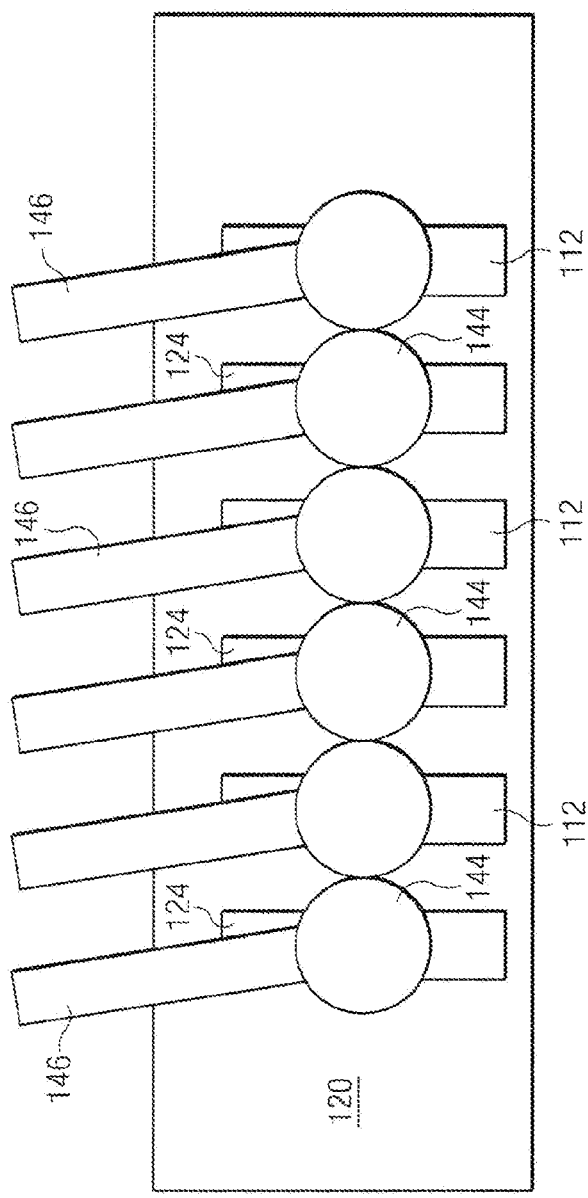
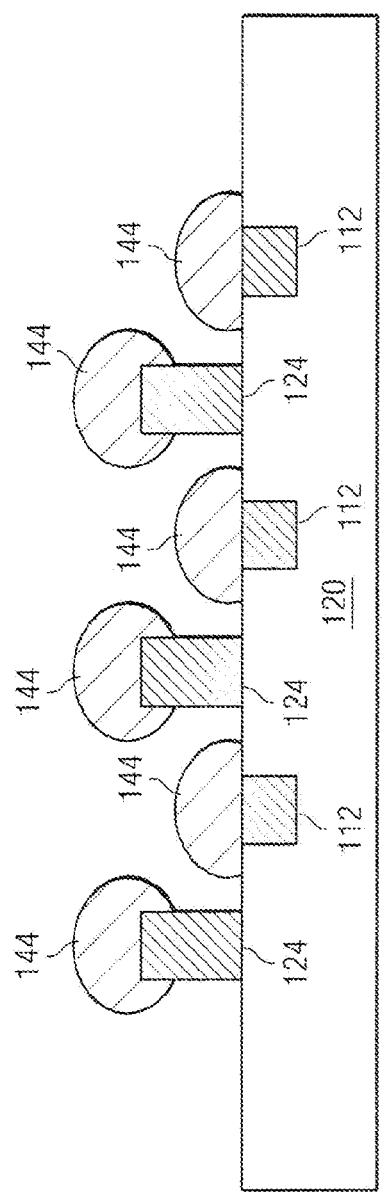

METHOD OF FORMING VERTICALLY OFFSET BOND ON TRACE INTERCONNECTS ON RECESSED AND RAISED BOND FINGERS

CLAIM TO DOMESTIC PRIORITY

The present invention is a continuation of U.S. patent application Ser. No. 13/019,562, filed Feb. 2, 2011, which is a division of U.S. application Ser. No. 12/207,986, filed Sep. 10, 2008, and claims priority to the foregoing application(s) pursuant to 35 U.S.C. §120.

FIELD OF THE INVENTION

The present invention relates in general to semiconductor devices and, more particularly, to a semiconductor device having vertically offset bond on trace (BOT) interconnects formed on recessed and raised bond fingers.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Many semiconductor devices require a fine pitch between the interconnect structures, e.g., between bond wire bumps, for a higher interconnect density and input/output (I/O) terminal count. To increase the I/O terminal count, the bond wire bumps can be laterally offset between bond fingers extending from the signal traces. The lateral offset allows the bond wire bumps to be placed closer together, i.e., small pitch, without electrically shorting adjacent terminals. However, the lateral offset also requires longer bond fingers in order to form the bond wire bumps, which consumes die area.

SUMMARY OF THE INVENTION

A need exists to decrease bond wire bump pitch without increasing the length of the bond fingers. Accordingly, in one embodiment, the present invention is a method of making a semiconductor device comprising the steps of providing a carrier, forming a first conductive layer extending above a surface of the carrier, providing a substrate, disposing the first conductive layer into a first surface of the substrate, removing the carrier, forming a second conductive layer extending above the first surface of the substrate to create a vertical offset between the first conductive layer and second conductive layer, and forming a plurality of first bumps over the first conductive layer and second conductive layer.

In another embodiment, the present invention is a method of making a semiconductor device comprising the steps of providing a substrate, disposing a first conductive layer into a first surface of the substrate, forming a second conductive layer extending above the first surface of the substrate to create a vertical offset between the first conductive layer and second conductive layer, and forming a first interconnect structure over the first conductive layer and second conductive layer.

In another embodiment, the present invention is a method of making a semiconductor device comprising the steps of providing a substrate, disposing a first conductive layer into a first surface of the substrate, forming a second conductive layer extending above the first surface of the substrate, and forming a first interconnect structure over the first conductive layer and second conductive layer.

In another embodiment, the present invention is a semiconductor device comprising a substrate and first conductive layer disposed into a first surface of the substrate. A second conductive layer extends above the first surface of the substrate. A first interconnect structure is formed over the first conductive layer and second conductive layer.

BRIEF DESCRIPTION OF THE DRAWINGS

FIGS. 4a-4b illustrate top and side views of the recessed and raised bond fingers which provide the vertically offset for the bond wire bumps.

DETAILED DESCRIPTION OF THE DRAWINGS

Figure 1:
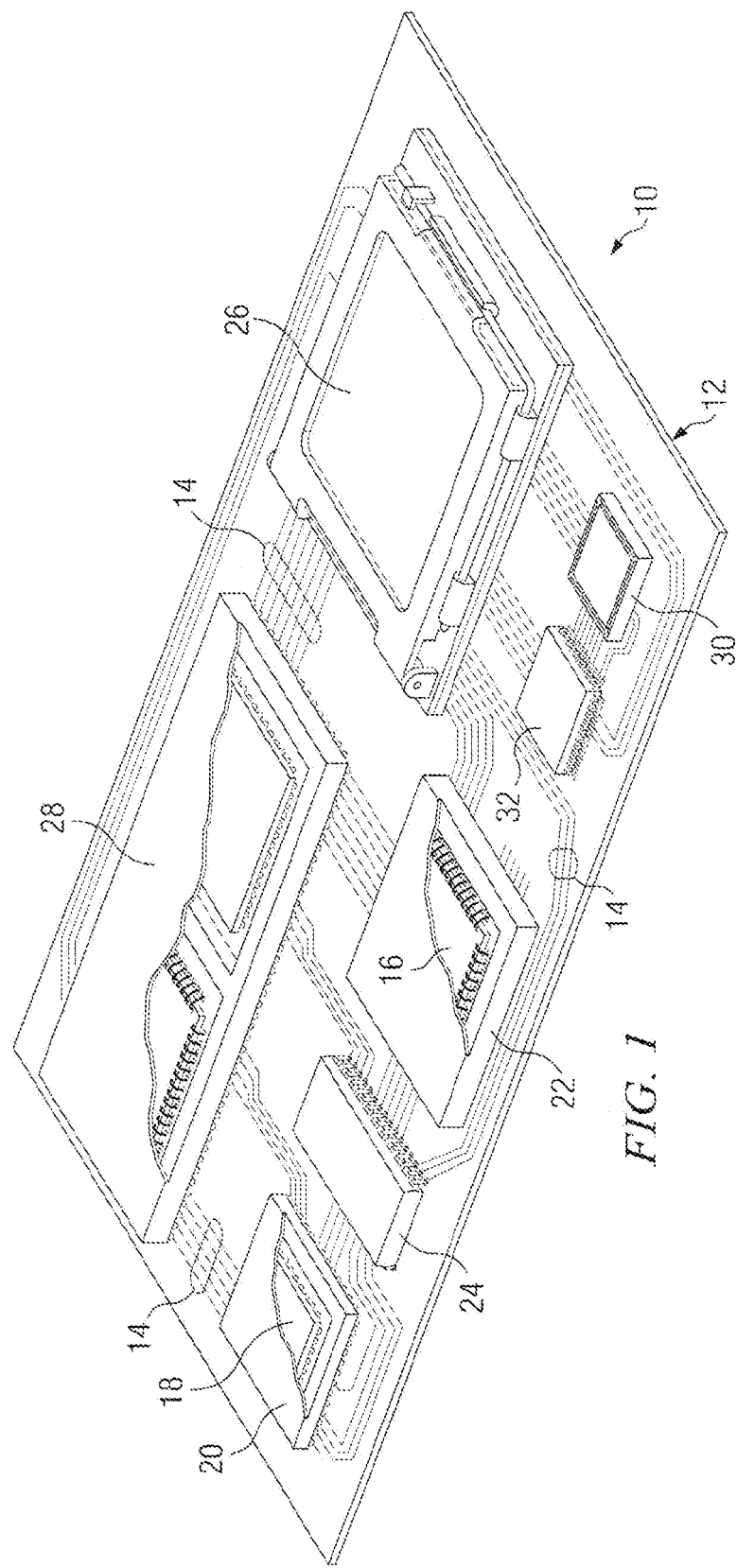
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components which are electrically connected to form circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, thin film deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by thin film deposition. The type of material being deposited determines the thin film deposition technique. The thin film deposition techniques include chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Some types of materials are patterned without being etched; instead patterns are formed by directly depositing the material into the areas or voids formed by a previous deposition/etch process using techniques such as electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is the technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically attached directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
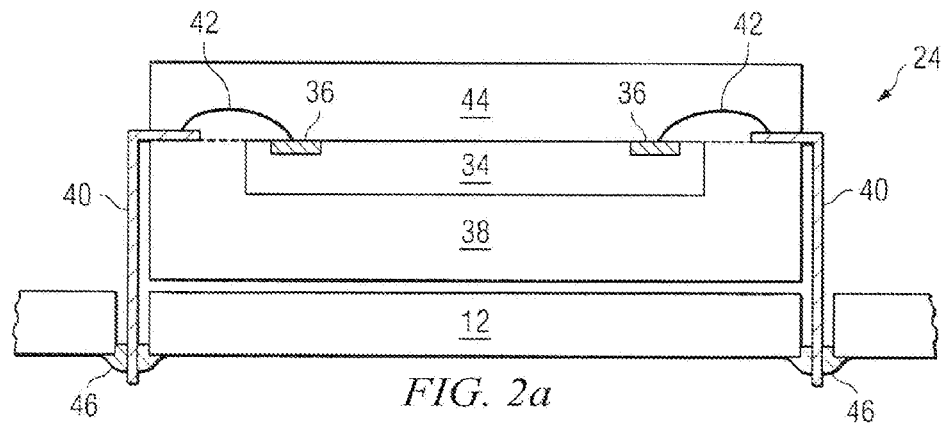
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active area containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active area of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as plastic or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
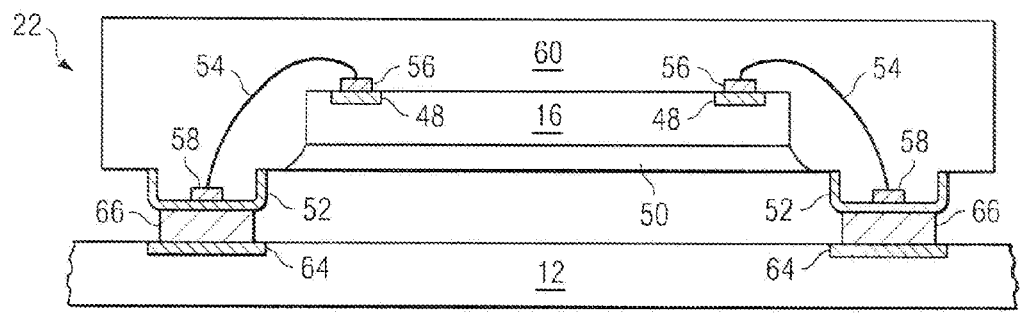

FIG. 2b illustrates further detail of BCC 22 mounted on PCB 12. Semiconductor die 16 is connected to a carrier by wire bond style first level packaging. BCC 22 is mounted to PCB 12 with a BCC style second level packaging. Semiconductor die 16 having contact pads 48 is mounted over a carrier using an underfill or epoxy-resin adhesive material 50. Semiconductor die 16 includes an active area containing analog or digital circuits implemented as active devices, passive devices, conductive layers, and dielectric layers formed within semiconductor die 16 and are electrically interconnected according to the electrical design of the die. For example, the circuit may include one or more transistors, diodes, inductors, capacitors, resistors, and other circuit elements formed within the active area of die 16. Contact pads 48 are made with a conductive material, such as Al, Cu, Sn, Ni, Au, or Ag, and are electrically connected to the circuit elements formed within die 16. Contact pads 48 are formed by PVD, CVD, electrolytic plating, or electroless plating process. Wire bonds 54 and bond pads 56 and 58 electrically connect contact pads 48 of semiconductor die 16 to contact pads 52 of BCC 22 forming the first level packaging. Molding compound or encapsulant 60 is deposited over semiconductor die 16, wire bonds 54, contact pads 48, and contact pads 52 to provide physical support and electrical isolation for the device. Contact pads 64 are formed on a surface of PCB 12 using evaporation, electrolytic plating, electroless plating, screen printing, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
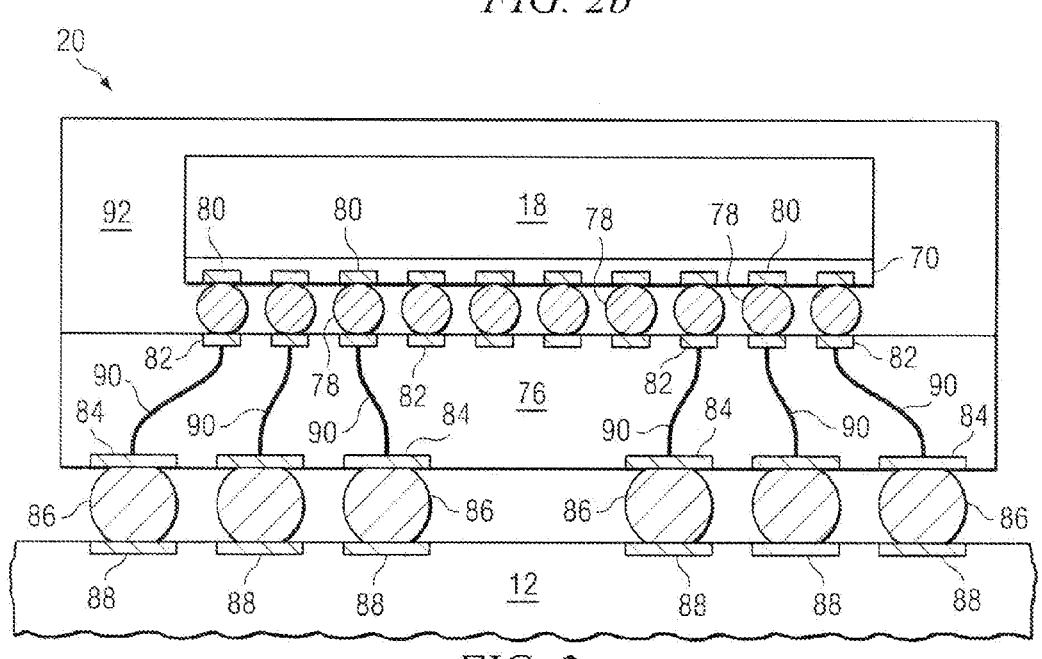

In FIG. 2c, semiconductor die 18 is mounted face down to carrier 76 with a flip chip style first level packaging. BGA 20 is attached to PCB 12 with a BGA style second level packaging. Active area 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active area 70 of semiconductor die 18. Semiconductor die 18 is electrically and mechanically attached to the carrier 76 through a large number of individual conductive solder bumps or balls 78. Solder bumps 78 are formed on bump pads or interconnect sites 80, which are disposed on active areas 70. Bump pads 80 are made with a conductive material, such as Al, Cu, Sn, Ni, Au, or Ag, and are electrically connected to the circuit elements formed in active area 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
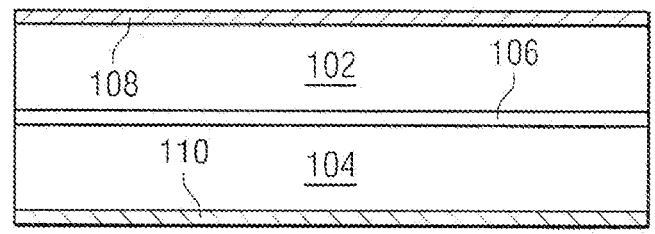
FIGS. 3a-3m illustrate a process of forming recessed and raised bond fingers to vertically offset bond wire bumps on a semiconductor wafer.

FIGS. 3*a*-3*m* illustrate a process of forming vertically offset bond on trace (BOT) interconnect sites for a semiconductor device. In FIG. 3*a*, a temporary metal carrier 102 is bonded to a similar temporary metal carrier 104 using adhesive 106. An electrically conductive layer 108 is formed on carrier 102. Likewise, an electrically conductive layer 110 is formed on carrier 104. Conductive layers 108 and 110 operate as seed layers and can be Cu, Ni, nickel vanadium (NiV), Au, or Al. The seed layers 108 and 110 are patterned and deposited using electrolytic plating, electroless plating, sputtering, PVD, CVD, or other suitable metal deposition process.

Figure 3B:
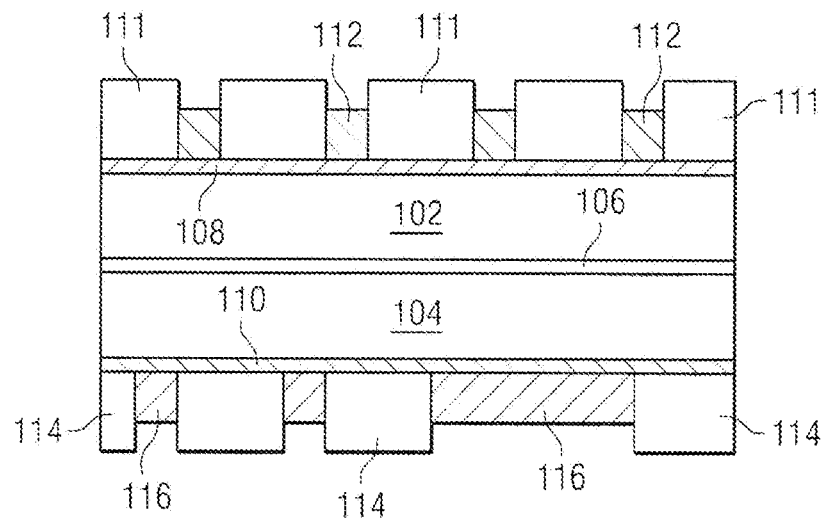
Figure 3C:
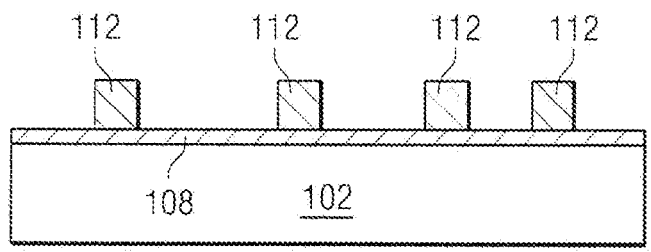

In FIG. 3*b*, high-resolution dry film photoresist layers 111 and 114 are formed over conductive layers 108 and 110, respectively. A portion of dry film layers 111 and 114 is removed to expose conductive layers 108 and 110.

An electrically conductive layer 112 is deposited in the removed portions of dry film layer 111 over the exposed areas of conductive layer 108. Likewise, an electrically conductive layer 116 is deposited in the removed portions of insulating layer 114 over the exposed areas of conductive layer 110. Conductive layers 112 and 116 can be Al, Cu, Sn, Ni, Au, Ag, or other suitable electrically conductive material. The deposition of conductive layers 112 and 116 uses PVD, CVD, electrolytic plating, or electroless plating process.

The dry film layers 111 and 114 are removed, leaving conductive layers 112 and 116 extending above seed layers 108 and 110, respectively. The carriers 102 and 104 are separated in FIG. 3*c*.

Figure 3D:
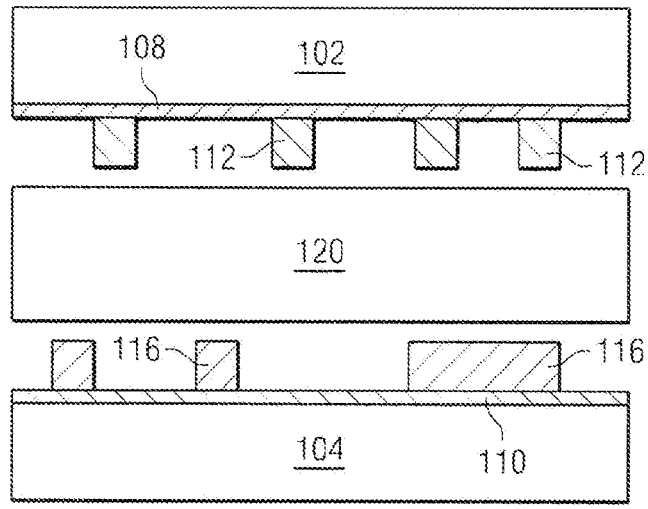
Figure 3E:
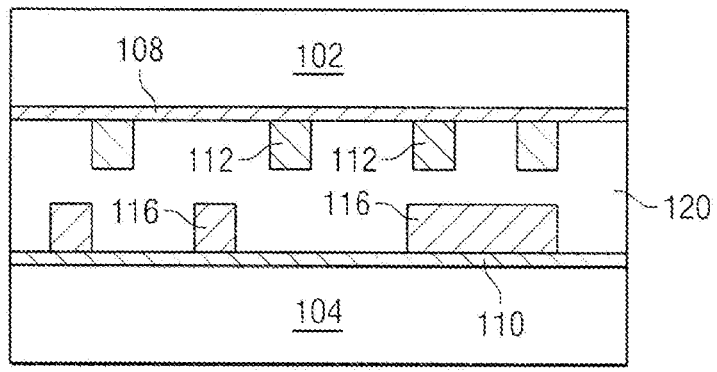
Figure 3F:
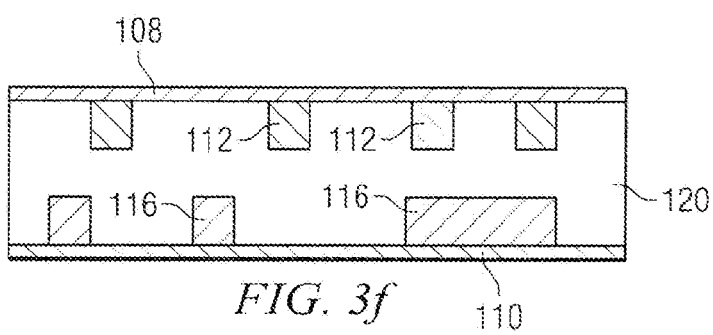

In FIG. 3*d*, carriers 102 and 104 are inverted and placed over substrate 120, leading with the conductive layers 112 and 116. Substrate 120 is made with silicon or other suitable base material. Conductive layers 112 and 116 are pressed into substrate 120 using a vacuum press (v-press) operation, as shown in FIG. 3*e*. The pressing operation recesses conductive layers 112 and 116 below a surface of substrate 120. The recessed conductive layers 112 and 116 contact conductive traces within substrate 120. The carriers 102 and 104 are removed in FIG. 3*f*.

Figure 3G:
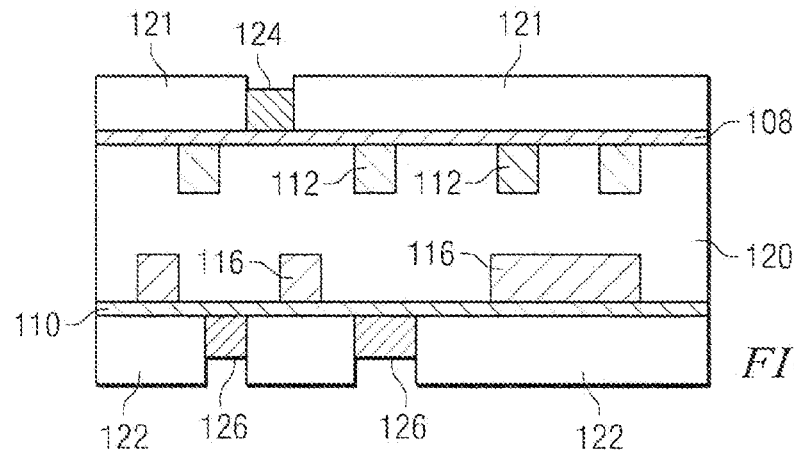

In FIG. 3*g*, a high-resolution dry film photoresist layers 121 is formed over conductive layer 108, opposite conductive layer 112. In a similar manner, a high-resolution dry film photoresist layer 122 is formed over conductive layer 110, opposite conductive layer 116. A portion of dry film layers 121 and 122 is removed to expose conductive layers 108 and 110.

An electrically conductive layer 124 is deposited in the removed portions of dry film layer 121 over the exposed areas of conductive layer 108. Likewise, an electrically conductive layer 126 is deposited in the removed portions of dry film layer 122 over the exposed areas of conductive layer 110. Conductive layers 124 and 126 can be Al, Cu, Sn, Ni, Au, Ag, or other suitable electrically conductive material. The deposition of conductive layers 124 and 126 uses PVD, CVD, electrolytic plating, or electroless plating process.

Figure 3H:
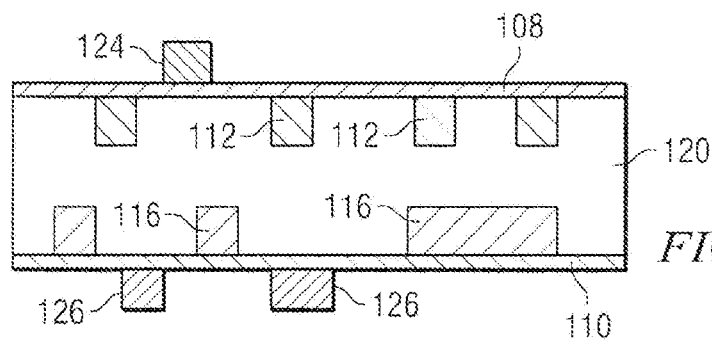
Figure 3I:
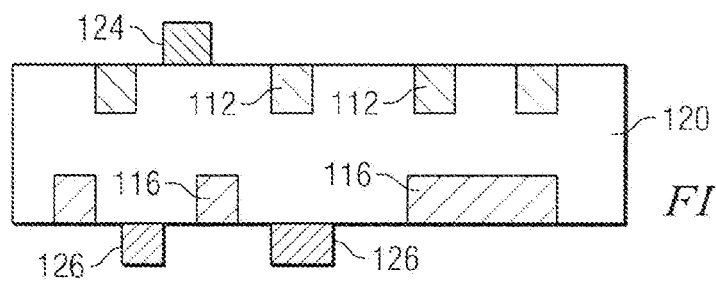

In FIG. 3*h*, dry film layers 121 and 122 are removed, leaving raised conductive layers 124 and 126 over seed layers 108 and 110, respectively. Seed layers 108 and 110 are removed in FIG. 3*i*, leaving conductive layers 112 and 116 embedded or recessed below a surface of substrate 120, and conductive layers 124 and 126 raised above the surface of substrate 120. In one embodiment, conductive layers 124 and 126 are 20 micrometers (μm) above substrate 120.

Figure 3J:
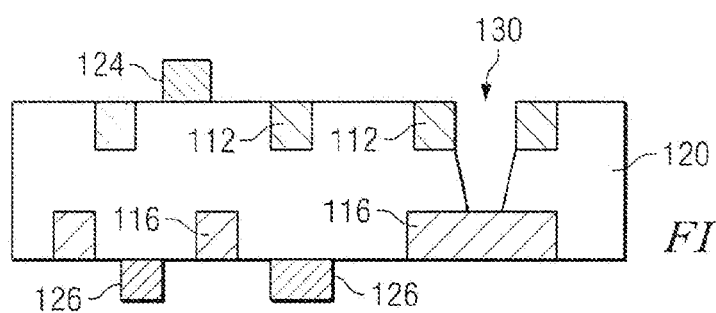
Figure 3K:
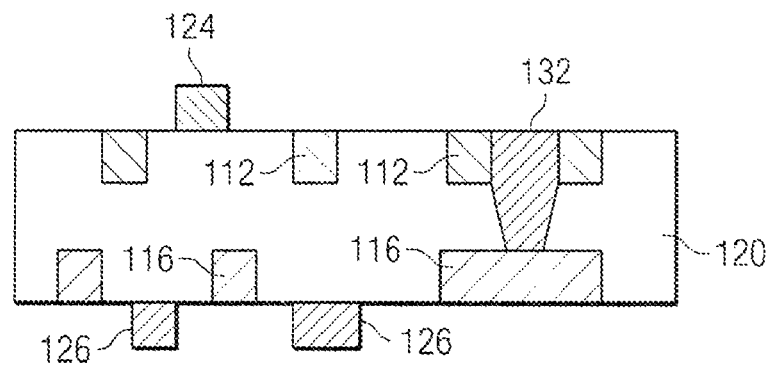

In FIG. 3*j*, via 130 is formed in substrate 120 using a laser drilling or etching operation. Via 130 is filled with conductive material 132 in FIG. 3*k* to electrically connect conductive layer 112 to conductive layer 116. Conductive material 132 can be Al, Cu, Sn, Ni, Au, Ag, or other suitable electrically conductive material.

Figure 3L:
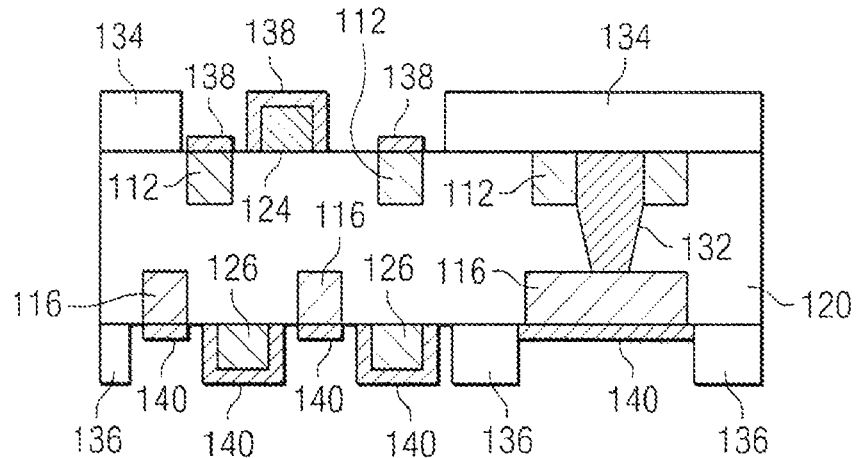
Figure 3M:
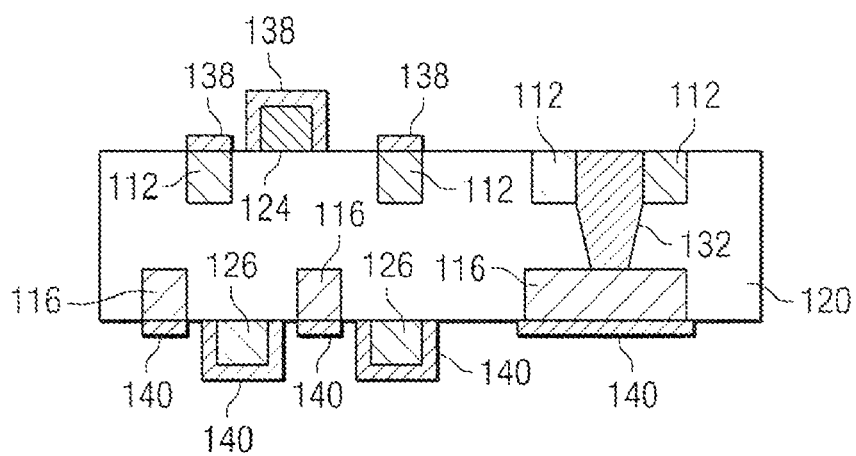

In FIG. 3*l*, high-resolution dry film photoresist layers 134 and 136 are formed over substrate 120. A portion of dry film layers 134 and 136 is removed to expose conductive layers 112, 114, 124, and 126. An electrically conductive layer 138 is formed over recessed conductive layer 112 and raised conductive layer 124. Likewise, an electrically conductive layer 140 is formed over recessed conductive layer 116 and raised conductive layer 126. Conductive layers 138 and 140 can be Al, Cu, Sn, Ni, Au, Ag, or other suitable electrically conductive material. The deposition of conductive layers 138 and 140 uses PVD, CVD, electrolytic plating, or electroless plating process. The dry film layers 134 and 136 are removed in FIG. 3*m*.

The recessed conductive layers 112 and 116, as well as raised conductive layers 124 and 126, are bond fingers within substrate 120. As seen in FIG. 4*a*, bond wire bumps 144 are formed on recessed bond fingers 112 and raised bond fingers 124, i.e., BOT interconnection. Bond wires 146 are routed to external electronic components. With 20 μm (0.8 mil) bond wires, the height of bond wire bumps 144 is about 10 μm. Bond wire pads 144 represent one type of interconnect structure. Other interconnect structures, such as conductive posts and pillars and solder bumps, can be formed on recessed bond fingers 112 and raised bond fingers 124. The bond fingers 112 and 124 provide interconnectivity between active and passive circuits formed on substrate 120 and the external electronic components.

FIG. 4*b* shows further detail of the vertical offset between bond wire bumps 144 formed on recessed bond fingers 112 and raised bond fingers 124. The vertical offset between recessed bond fingers 112 and raised bond fingers 124 allows bond wire bumps to be placed closer together, e.g., smaller pitch. The outer dimensions of bond wire bumps 144 can overlap in the plan view of FIG. 4*a*, but do not electrically short due to the physical separation between the bumps provided by the vertical offset, as seen in FIG. 4*b*. The interconnect density of the bond wires increases with the smaller pitch of the bond wire bumps, without increasing the length of the bond fingers. In addition, the smaller pitch provides for smaller bond wires which reduces manufacturing cost.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a carrier;
   forming a first conductive layer extending above a surface of the carrier;
   providing a substrate;
   disposing the first conductive layer into a first surface of the substrate;
   removing the carrier;
   forming a second conductive layer extending above the first surface of the substrate to create a vertical offset between the first conductive layer and second conductive layer; and
   forming a plurality of first bumps over the first conductive layer and second conductive layer.

2. The method of claim 1, further including:
   disposing a third conductive layer into a second surface of the substrate opposite the first surface of the substrate;

forming a fourth conductive layer extending above the second surface of the substrate to create a vertical offset between the third conductive layer and fourth conductive layer; and forming a plurality of second bumps over the third conductive layer and fourth conductive layer.

3. The method of claim 1, wherein the vertical offset between the first conductive layer and second conductive layer is about 20 micrometers.

4. The method of claim 1, further including forming a third conductive layer over the second conductive layer.

5. The method of claim 1, further including forming a conductive via through the substrate.

6. The method of claim 1, further including:

forming a seed layer over the carrier prior to forming the first conductive layer; and removing a portion of the seed layer after forming the second conducive layer.

7. A method of making a semiconductor device, comprising:

providing a substrate;

disposing a first conductive layer into a first surface of the substrate;

forming a second conductive layer extending above the first surface of the substrate to create a vertical offset between the first conductive layer and second conductive layer; and forming a first interconnect structure over the first conductive layer and second conductive layer.

8. The method of claim 7, further including:

disposing a third conductive layer into a second surface of the substrate opposite the first surface of the substrate;

forming a fourth conductive layer extending above the second surface of the substrate to create a vertical offset between the third conductive layer and fourth conductive layer; and forming a second interconnect structure over the third conductive layer and fourth conductive layer.

9. The method of claim 7, wherein the vertical offset between the first conductive layer and second conductive layer is about 20 micrometers.

10. The method of claim 7, further including forming a third conductive layer over the second conductive layer.

11. The method of claim 7, further including forming a conductive via through the substrate.

12. The method of claim 7, wherein the first interconnect structure includes a plurality of bumps or a plurality of conductive posts.

13. The method of claim 7, further including forming a photoresist layer over the substrate comprising an opening to expose the first conductive layer and second conductive layer.

14. A method of making a semiconductor device, comprising:

providing a substrate;

disposing a first conductive layer into a first surface of the substrate;

forming a second conductive layer extending above the first surface of the substrate; and forming a first interconnect structure over the first conductive layer and second conductive layer.

15. The method of claim 14, further including:

disposing a third conductive layer into a second surface of the substrate opposite the first surface of the substrate;

forming a fourth conductive layer extending above the second surface of the substrate; and forming a second interconnect structure over the third conductive layer and fourth conductive layer.

16. The method of claim 14, wherein a vertical offset between the first conductive layer and second conductive layer is about 20 micrometers.

17. The method of claim 14, further including forming a third conductive layer over the second conductive layer.

18. The method of claim 14, further including forming a conductive via through the substrate.

19. The method of claim 14, wherein the first interconnect structure includes a plurality of bumps or a plurality of conductive posts.

* * * * *